(12) United States Patent
Bissey et al.

(10) Patent No.: US 8,785,989 B2
(45) Date of Patent: Jul. 22, 2014

(54) SEMICONDUCTOR CONSTRUCTIONS

(75) Inventors: Lucien J. Bissey, Boise, ID (US);
William A. Stanton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 316 days.

(21) Appl. No.: 13/108,847

(22) Filed: May 16, 2011

(65) Prior Publication Data
US 2011/0215387 A1 Sep. 8, 2011

Related U.S. Application Data

(60) Division of application No. 12/196,114, filed on Aug. 21, 2008, now Pat. No. 7,964,503, which is a continuation of application No. 11/341,201, filed on Jan. 27, 2006, now Pat. No. 7,432,197.

(51) Int. Cl.
| | |
|---|---|
| *H01L 29/772* | (2006.01) |
| *G03F 7/00* | (2006.01) |
| *H01L 21/768* | (2006.01) |
| *H01L 21/311* | (2006.01) |
| *H01L 21/312* | (2006.01) |

(52) U.S. Cl.
CPC ........ *G03F 7/0035* (2013.01); *H01L 21/76897* (2013.01); *H01L 21/31144* (2013.01); *H01L 21/312* (2013.01)
USPC 257/288; 257/632; 257/E29.02; 257/E29.242

(58) Field of Classification Search
CPC ............ G03F 7/0035; H01L 21/76897; H01L 21/31144; H01L 21/312
USPC .................................. 257/288, 632
See application file for complete search history.

(56) References Cited

U.S. PATENT DOCUMENTS

| | | | |
|---|---|---|---|
| 4,578,344 A | 3/1986 | Griffing et al. | |
| 4,663,275 A | 5/1987 | West et al. | |
| 4,677,049 A | 6/1987 | Griffing et al. | |
| 4,812,418 A | 3/1989 | Pfiester et al. | |
| 4,977,048 A | 12/1990 | Waldo, III | |
| 4,990,665 A | 2/1991 | Griffing et al. | |
| 5,002,993 A | 3/1991 | West et al. | |
| 5,024,919 A | 6/1991 | Yamauchi | |
| 5,106,723 A | 4/1992 | West et al. | |
| 5,108,874 A | 4/1992 | Griffing et al. | |
| 5,196,295 A | 3/1993 | Davis | |
| 6,294,317 B1 | 9/2001 | Calistri-Yeh et al. | |
| 6,407,440 B1 * | 6/2002 | Rhodes .................... | 257/462 |

(Continued)

OTHER PUBLICATIONS

Geary et al., "Contrast Enhancement Materials for Yield Improvement in Submicron I-line Lithography", 10 pages; dated prior to Jan. 27, 2006.

(Continued)

*Primary Examiner* — Alexander Ghyka
(74) *Attorney, Agent, or Firm* — Wells St. John P.S.

(57) ABSTRACT

The invention includes semiconductor constructions containing optically saturable absorption layers. An optically saturable absorption layer can be between photoresist and a topography, with the topography having two or more surfaces of differing reflectivity relative to one another. The invention also includes methods of patterning photoresist in which a saturable absorption layer is provided between the photoresist and a topography with surfaces of differing reflectivity, and in which the differences in reflectivity are utilized to enhance the accuracy with which an image is photolithographically formed in the photoresist.

13 Claims, 17 Drawing Sheets

(56) References Cited

U.S. PATENT DOCUMENTS

| | | |
|---|---|---|
| 6,682,949 B2 | 1/2004 | Ukita |
| 6,864,039 B2 | 3/2005 | Cheng et al. |
| 6,864,152 B1 | 3/2005 | Mirbedini et al. |
| 6,882,416 B1 | 4/2005 | Hunter et al. |
| 7,012,684 B1 | 3/2006 | Hunter |
| 7,432,197 B2 * | 10/2008 | Bissey et al. ............ 438/669 |
| 2002/0045103 A1 * | 4/2002 | Kewitsch et al. ............ 430/1 |
| 2002/0142561 A1 | 10/2002 | Stanton et al. |
| 2004/0091789 A1 | 5/2004 | Han et al. |
| 2004/0164335 A1 * | 8/2004 | DeBoer et al. ............ 257/296 |
| 2004/0233537 A1 | 11/2004 | Agrawal et al. |
| 2005/0123839 A1 | 6/2005 | Kim et al. |
| 2007/0092829 A1 | 4/2007 | Noelscher et al. |
| 2007/0105043 A1 | 5/2007 | Elian et al. |

OTHER PUBLICATIONS

ShinMicroSi, Inc., "Shin-EtsuMicroSi Contrast Enhancement Materials", pp. 1-7 Product Brochure for CEM 365HR; dated piroir to Jan. 27, 2006.

* cited by examiner

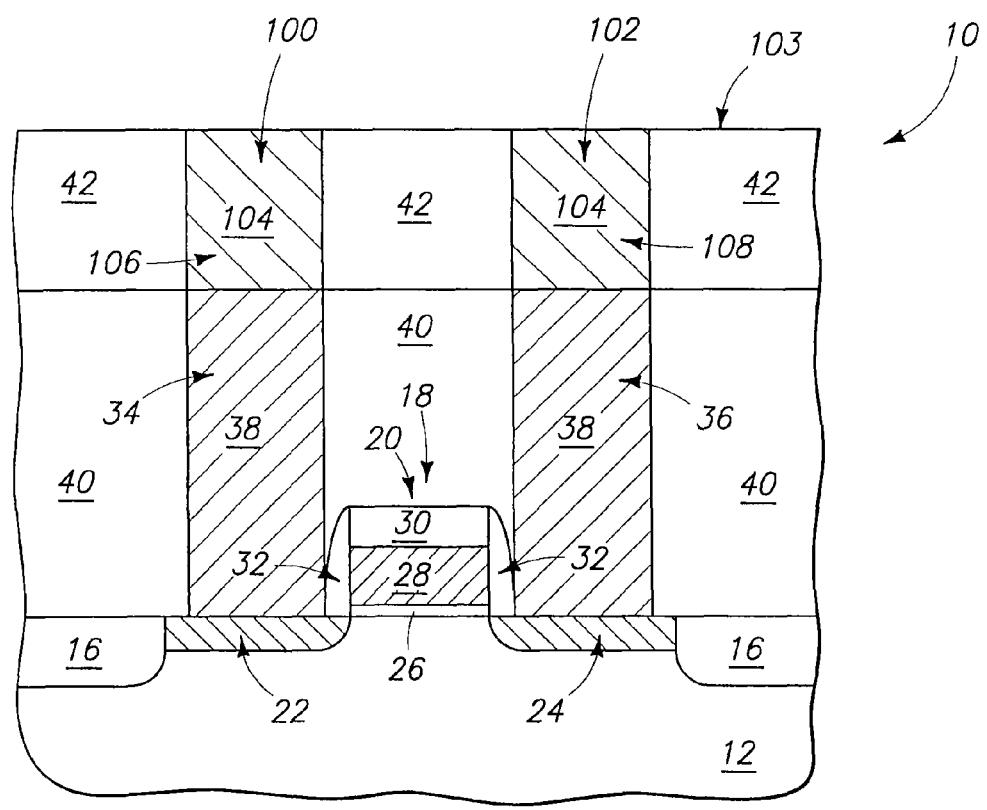
F I G 8 8

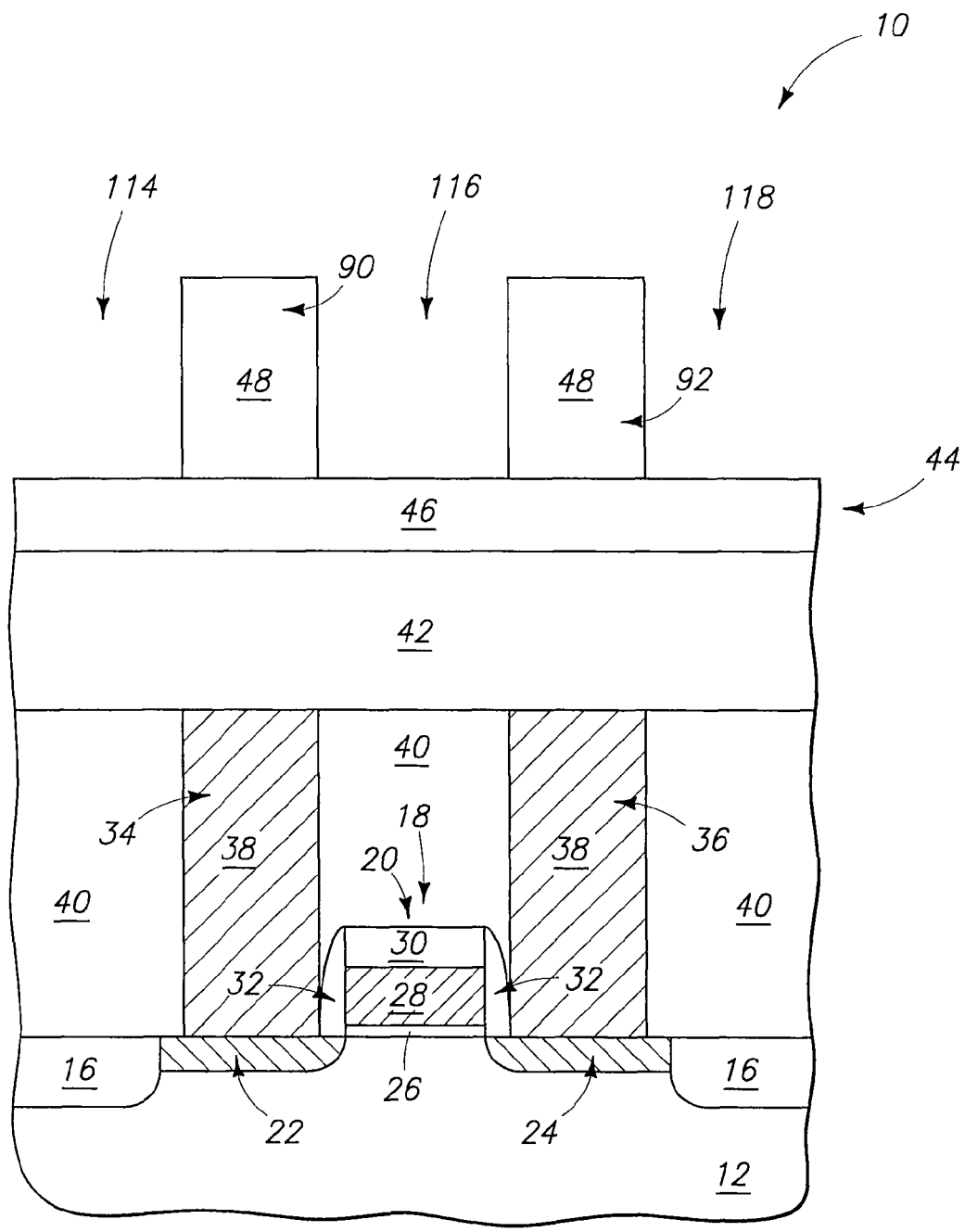
F I G. 10

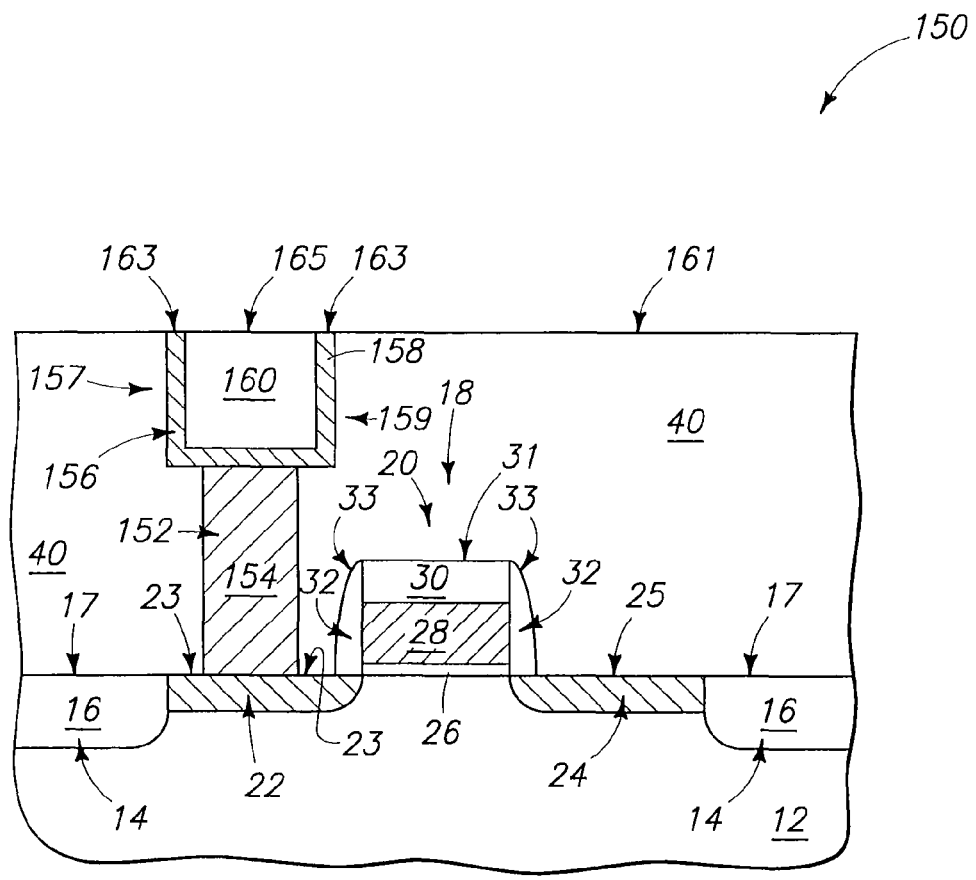
F I G 12

SEMICONDUCTOR CONSTRUCTIONS

RELATED PATENT DATA

This patent resulted from a divisional of U.S. patent application Ser. No. 12/196,114, which was filed Aug. 21, 2008, which issued as U.S. Pat. No. 7,964,503, and which is hereby incorporated herein by reference; which resulted from a continuation of U.S. patent application Ser. No. 11/341,201, which was filed Jan. 27, 2006, is now U.S. Pat. No. 7,432,197, and which is hereby incorporated herein by reference.

TECHNICAL FIELD

The invention pertains to semiconductor constructions, methods of forming semiconductor constructions, and methods of patterning photoresist.

BACKGROUND OF THE INVENTION

Photolithography is commonly utilized to form microstructures, with exemplary microstructures being integrated circuit devices and Micro-Electro-Mechanical Systems (MEMS). Photolithography utilizes patterned electromagnetic radiation (typically ultraviolet light) to create a desired pattern in a photosensitive material (photoresist).

In typical processing, photoresist is coated on the substrate, and electromagnetic radiation is passed through a patterned mask (typically called a reticle) to form a pattern of exposed and unexposed regions of the photoresist. The photoresist is then developed to selectively remove either the exposed or unexposed regions. If the exposed regions are removed, the resist is referred to as a positive resist; and if the unexposed regions are removed, the resist is referred to as a negative resist.

The patterned resist can subsequently be utilized as a sacrificial mask for patterning layers underlying the resist. Alternatively, the patterned photoresist can be a non-sacrificial material utilized as an element of a microstructure.

A continuing goal is to decrease the dimensions of microstructures. It is desired to form patterns in photoresist with ever-increasing accuracy as the desired sizes of microstructures continue to shrink, and this is creating difficulties with present photolithographic techniques.

An exemplary application for photolithography is to form patterns in upper layers of materials that are desired to align with patterns in underlying layers. For instance, in semiconductor manufacturing it is often desired to establish vertically-extending electrical connection between upper conductive structures and lower conductive structures. As device dimensions decrease, this becomes an increasingly difficult challenge. Alignment tolerances are now approaching nanometer dimensions.

At the tight tolerances of present-day manufacturing, misalignment of photolithographically-formed patterns in upper layers relative to structures in lower layers is common, and accordingly numerous procedures have been developed for addressing misalignment problems.

One method is to avoid photolithography, and to instead use self-aligned-contact methods where the selectivity of different materials to different etch chemistries is used to pattern materials. Such methodology can be useful in particular circumstances, but creates problems in developing appropriate etch chemistries, development times, and etching conditions.

Another method is to utilize methods of self-assembly at the molecular level so that devices assemble themselves in a predictable manner. This technology holds promise, but is still in its infancy.

Yet another method is to use photolithography, but to enlarge the features patterned in the photoresist so that the patterned area is large enough to compensate for estimated amounts of misalignment. This methodology can alleviate misalignment-caused problems, and has been utilized with a substantial degree of success. However, the methodology wastes valuable semiconductor real estate.

It is desired to develop new methods which can improve accuracy with which patterns are formed in photosensitive materials.

SUMMARY OF THE INVENTION

In one aspect, the invention includes a method of patterning photoresist. A construction is provided which has an optically saturable absorption layer—also referred to as a layer of photo-bleachable material; or as a layer of contrast enhancement material (CEM)—over a topography with surfaces which differ in reflectivity relative to one another. Photoresist is formed over the optically saturable absorption layer. Electromagnetic radiation is directed into the photoresist. Some of the directed electromagnetic radiation passes through the photoresist, to the topography, and then reflects back from the topography to the photoresist. The difference in reflectivity of the surfaces of the topography patterns the reflected electromagnetic radiation. The directed electromagnetic radiation and patterned reflected electromagnetic radiation together expose a first portion of the photoresist to a threshold dose of radiation while a second portion of the photoresist remains not exposed to the threshold dose. The photoresist is then developed to selectively remove either the first or second portion of the photoresist relative to the other of the first and second portions.

In one aspect, the invention includes a method of patterning photoresist over a semiconductor construction. The semiconductor construction is provided to have first and second regions, with the first region being more reflective than the second region. An optically saturable absorption layer is formed over the first and second regions. Photoresist is formed over the optically saturable absorption layer. Electromagnetic radiation is reflected from the first region to optically alter a segment of the optically saturable absorption layer beneath the photoresist and thereby increase transparency of such segment. Electromagnetic radiation is directed into the photoresist. Some of the directed electromagnetic radiation passes through the photoresist, bounces from the first region, through the altered segment of the optically saturable absorption layer and into the photoresist. The directed electromagnetic radiation and bounced electromagnetic radiation together expose a first portion of the photoresist to a threshold dose of radiation while a second portion of the photoresist remains not exposed to the threshold dose. The photoresist is then developed to selectively remove either the first or second portion of the photoresist relative to the other the first and second portions.

In one aspect, the invention includes a method of forming a semiconductor construction. A semiconductor substrate is provided. At least one structure is formed over the semiconductor substrate, with such structure appearing in at least one cross-sectional view to comprise spaced projections formed over the substrate. The spaced projections have upper surfaces which are defined to be first surfaces. Regions between the spaced projections have upper surfaces which are defined to be the second surfaces. The first surfaces have greater reflectivity than the second surfaces. A first layer is formed over the first and second surfaces. A second layer is formed over the first layer, with the second layer being an optically saturable absorption layer. Photoresist is formed over the optically saturable absorption layer. Electromagnetic radiation is reflected from the first surfaces to optically alter a segment of the optically saturable absorption layer beneath the photoresist and thereby increase transparency of such segment. Any electromagnetic radiation reflected from the second surfaces is insufficient to significantly alter transparency of the optically saturable absorption layer. Electromagnetic radiation is directed into the photoresist. Some of the directed electromagnetic radiation passes through the photoresist, bounces from the first surfaces, through the altered segment of the optically saturable absorption layer and into the photoresist. The directed electromagnetic radiation and bounced electromagnetic radiation together expose a first portion of the photoresist to a threshold dose of radiation while a second portion of the photoresist remains not exposed to the threshold dose. The photoresist is developed to selectively removed either the first or second portion of the photoresist relative to the other of the first and second portions, and thereby form gaps in the photoresist selectively over designated regions comprising either the first surfaces or the second surfaces. The gaps are then extended through the first and second layers, and to the designated regions.

In one aspect, the invention includes a semiconductor construction. Such construction comprises a semiconductor substrate. The construction further comprises, in at least one cross-sectional view, spaced projections over the substrate. Such projections are spaced from one another by an intervening region. A first layer is over the spaced projections and over the intervening region between the spaced projections. An optically saturable absorption layer is over the first layer, and photoresist is over the optically saturable absorption layer.

BRIEF DESCRIPTION OF THE DRAWINGS

Preferred embodiments of the invention are described below with reference to the following accompanying drawings.

FIG. 8 is a view of the fragment of FIG. 1 shown at a processing stage subsequent to that of FIG. 7.

FIG. 10 is a view of the fragment of FIG. 1 shown at a processing stage subsequent to that of FIG. 5 in accordance with an aspect of the invention alternative to that shown in FIG. 6.

FIG. 12 is a diagrammatic, cross-sectional view of a semiconductor wafer fragment shown at a processing stage analogous to that of FIG. 1 in accordance with yet another aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes aspects for improving photolithographic patterning. In some aspects, radiation-reflective properties of materials underlying a photoresist layer are utilized in conjunction with an optically saturable absorption layer to pattern electromagnetic radiation during photolithographic patterning of the photoresist. Exemplary aspects of the invention are described with reference to FIGS. 1-17.

Figure 1:
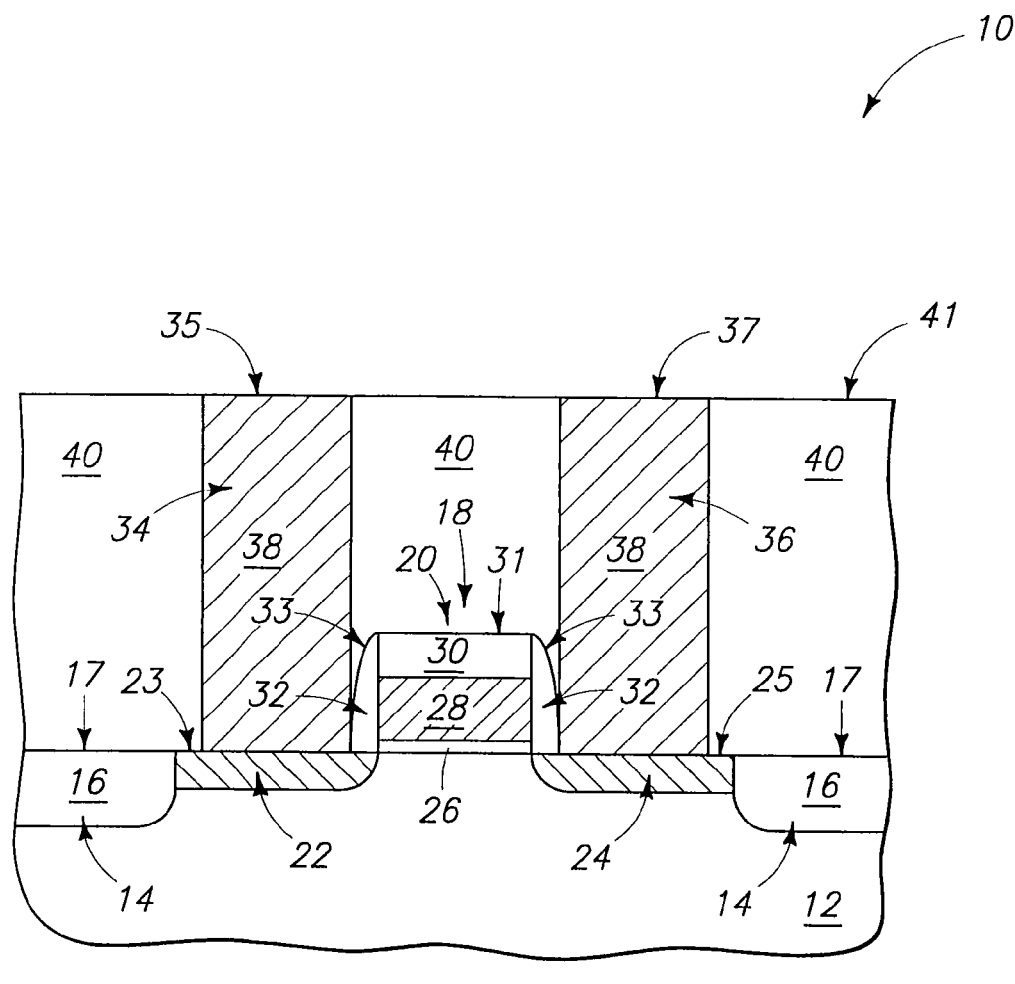
FIG. 1 is a diagrammatic, cross-sectional view of a semiconductor wafer fragment at a preliminary processing stage of a method in accordance with an exemplary aspect of the present invention.

Referring to FIG. 1, a semiconductor construction 10 is illustrated at a preliminary processing stage. The construction includes a substrate 12 which can comprise any of various semiconductor materials, including, for example, monocrystalline silicon. In some aspects, substrate 12 can comprise, consist essentially of, or consist of monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of isolation regions 14 extend into the substrate, with such isolation regions containing electrically insulative material 16. The electrically insulative material can, for example, comprise, consist essentially of, or consist of silicon dioxide. The isolation regions can be any suitable isolation regions, and in some aspects will be shallow trench isolation regions. The isolation regions have uppermost surfaces 17 corresponding to uppermost surfaces of material 16.

A transistor 18 is supported by substrate 12. The transistor comprises a gate stack 20 over the substrate, and conductively-doped source/drain regions 22 and 24 within the substrate and on opposing sides of the gate stack. The source/drain regions can be either majority n-type doped or majority p-type doped, as will be recognized by persons of ordinary skill in the art.

The gate stack 20 comprises gate dielectric 26, conductive gate material 28, and an electrically insulative cap 30.

The gate dielectric 26 can comprise any suitable composition or combination of compositions, and in particular aspects can comprise, consist essentially of, or consist of silicon oxide.

The conductive gate material 28 can comprise any suitable composition or combination of compositions, and in some aspects can comprise, consist essentially of, or consist of one or more of various metals, metal compositions, and conductively-doped semiconductor material.

The insulative cap 30 can comprise any suitable composition or combination of compositions, and in some aspects can comprise, consist essentially of, or consist of one or both of silicon dioxide and silicon nitride. The cap 30 has an uppermost surface 31.

Although the gate dielectric 26, conductive material 28 and insulative cap 30 are all shown to be homogeneous, it is to be understood that the invention includes aspects in which one or more of such structures can contain two or more layers of differing composition relative to one another.

Sidewall spacers 32 are on opposing sidewalls of the gate stack. The sidewall spacers can comprise any suitable composition or combination of compositions, and in particular aspects can comprise, consist essentially of, or consist of one or both of silicon dioxide and silicon nitride. The sidewall spacers have outer surfaces 33.

A pair of electrically conductive pedestals 34 and 36 extend vertically from substrate 12, and are in electrical connection with source/drain regions 22 and 24, respectively. Pedestals 34 and 36 comprise electrically conductive material 38 which can correspond to any suitable composition or combination of compositions. In some aspects, the electrically conductive material 38 can comprise, consist essentially of, or consist of any of various metals, metal compositions, or conductively-doped semiconductor material. Although the material 38 of the pedestals is shown to be homogeneous, it is to be understood that the invention also includes aspects in which such material comprises two or more layers having differing composition relative to one another.

The pedestals only cover portions of source/drain regions 22 and 24, and accordingly such source/drain regions have surfaces 23 and 25, respectively, extending outwardly beyond the pedestals. Such surfaces can comprise, for example, conductively-doped monocrystalline silicon.

An electrically insulative material 40 is over substrate 12, and over transistor 18. The pedestals 34 and 36 extend through such insulative material to electrically couple with the source/drain regions 22 and 24.

Electrically insulative material 40 can comprise any suitable composition or combination of compositions, and in some aspects can comprise, consist essentially of, or consist of one or more of borophosphosilicate glass (BPSG), phosphosilicate glass (PSG), fluorosilicate glass (FSG), silicon dioxide and silicon nitride. Although the material 40 is shown to be homogeneous, it is to be understood that the invention also includes aspects in which such material comprises two or more layers having differing composition relative to one another.

Construction 10 is shown to comprise a planarized upper surface 41 extending across insulative material 40, and across pedestals 34 and 36. The pedestals 34 and 36 have upper surfaces 35 and 37, respectively, that are part of planarized surface 41.

Reflective properties of various materials of the FIG. 1 construction can be utilized during photolithographic patterning of a photoresist subsequently formed over upper surface 41. The material 40 can be at least somewhat transparent to electromagnetic radiation utilized during the photolithographic patterning so that the electromagnetic radiation reaches surfaces of the structures underlying material 40. Specifically, the electromagnetic radiation can reach one or more of upper surfaces 17, 23, 25, 31 and 33. The upper surfaces 35 and 37 of the pedestals can comprise metal, metal compounds, or other relatively highly reflective compositions; and the upper surfaces 17, 23, 25, 31 and 33 can comprise compositions that are less reflective than those of surfaces 35 and 37. Accordingly, construction 10 can be considered to comprise a topography impacted by electromagnetic radiation directed downwardly toward construction 10, with such topography containing surfaces 17, 23, 25, 31, 33, 35 and 37; and with surfaces 35 and 37 differing in reflectivity relative to the other surfaces of the topography. In some aspects, the surfaces 35 and 37 of the spaced pedestals 34 and 36 can be considered to define a first region of construction 10 having relatively high reflectivity, and surfaces between the spaced pedestals can be considered to define a second region having low reflectivity in comparison to the first region.

If material 40 is not transparent to the electromagnetic radiation reaching such material, the topography impacted by electromagnetic radiation directed downwardly toward construction 10 can be considered to comprise upper surfaces of material 40 and the upper surfaces of the pedestals 34 and 36.

The construction 10 of FIG. 1 can correspond to a unit of an array of repeating structures. Accordingly, the transistor and pair of pedestals of FIG. 1 can be representative of a number of identical structures formed over substrate 12 at the processing stage of FIG. 1.

Figure 2:
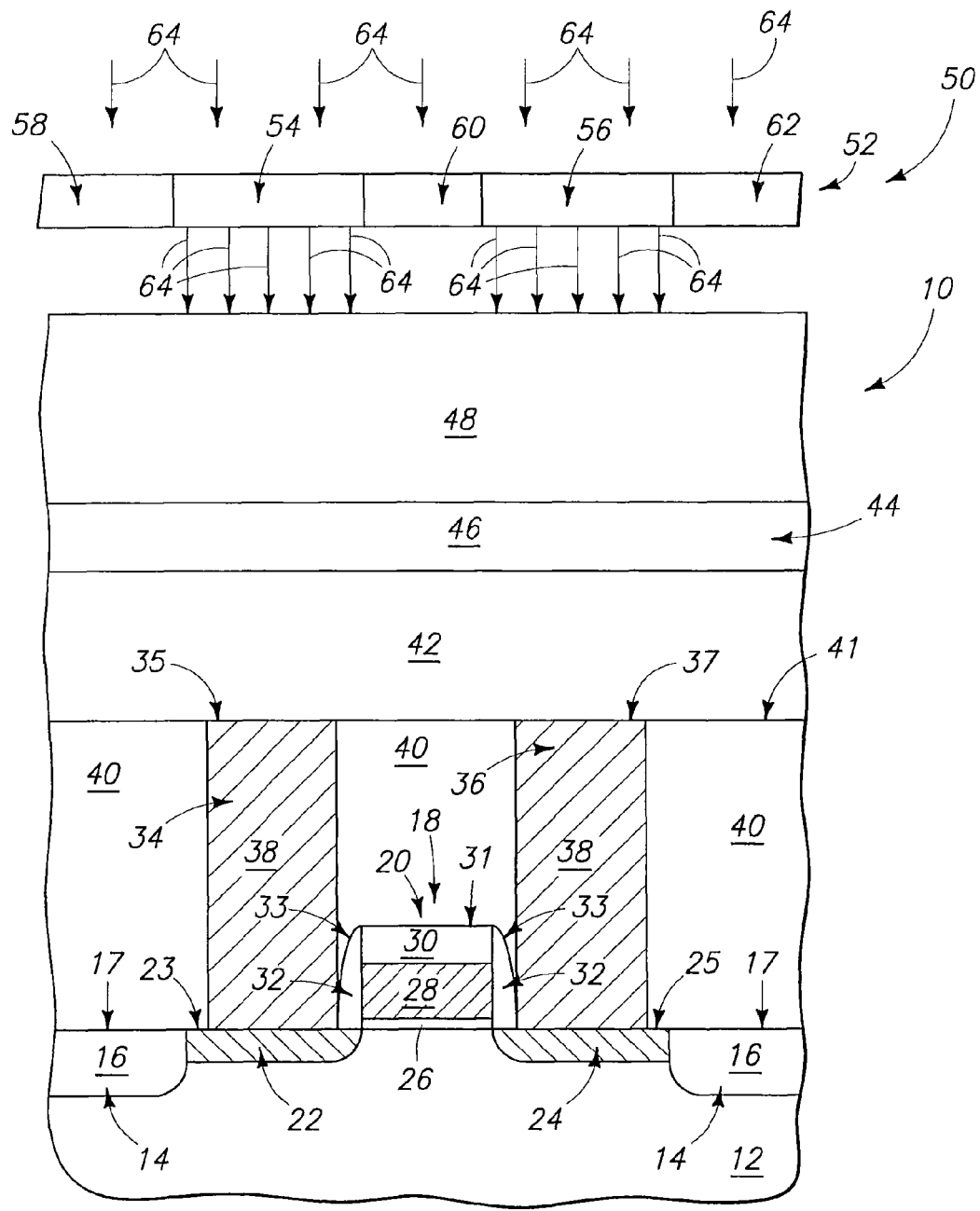
FIG. 2 is a view of the fragment of FIG. 1 in an assembly utilized for a processing stage subsequent to that of FIG. 1.

Referring to FIG. 2, a layer of material 42 is formed over upper surface 41. Material 42 is ultimately to have a pattern formed therethrough to designated portions of surface 41, and can comprise any suitable composition or combination of compositions. In typical aspects, material 42 will be electrically insulative and will comprise, consist essentially of, or consist of one or more of BPSG, PSG, FSG, silicon dioxide and silicon nitride. Although material 42 is shown to be homogeneous, it is to be understood that the invention also includes aspects in which material 42 comprises two or more layers having differing composition relative to one another.

Material 42 can be understood to be formed over the topography discussed above with reference to FIG. 1. Specifically, material 42 is formed over surfaces 35 and 37 of the pedestals, and over surfaces between the pedestals.

An optically saturable absorption layer 44 is formed over material 42. Layer 44 comprises contrast enhancement material (also referred to as photo-bleachable material) 46. The material 46 can comprise any suitable composition or combination of compositions, including, for example, one or more contrast enhancement materials available from ShinMicroSI, Inc. of Phoenix, Ariz., with an exemplary contrast enhancement material being CEM 365HR. Although only one optically saturable absorption layer is shown, it is to be understood that the invention can also include aspects in which multiple optically saturable absorption layers are utilized.

In some aspects, the layer comprising material 42 can be considered to be a first layer formed over underlying surfaces having different reflectivity relative to one another, and the layer 44 can be considered to be a second layer which is formed over the first layer.

Photoresist 48 is formed over optically saturable absorption layer 44. Although photoresist 48 is shown to be homogeneous, it is to be understood that the invention also includes aspects in which the photoresist is not homogeneous. The photoresist can comprise any suitable composition or combination of compositions, and can be either a positive photoresist or a negative photoresist.

The materials 42, 46 and 48 are incorporated into construction 10, and the construction is then provided in an assembly 50 comprising a reticle 52 (or photomask) and a source of electromagnetic radiation (not shown).

The reticle has radiation-patterning features formed therein. Such features comprise windows 54 and 56 through which electromagnetic radiation can pass; and comprise non-transparent regions 58, 60 and 62 which block the electromagnetic radiation.

Electromagnetic radiation 64 is emitted from the source and directed through the reticle, which patterns the electromagnetic radiation as shown. The patterned electromagnetic radiation is directed into the photoresist 48.

Figure 3:
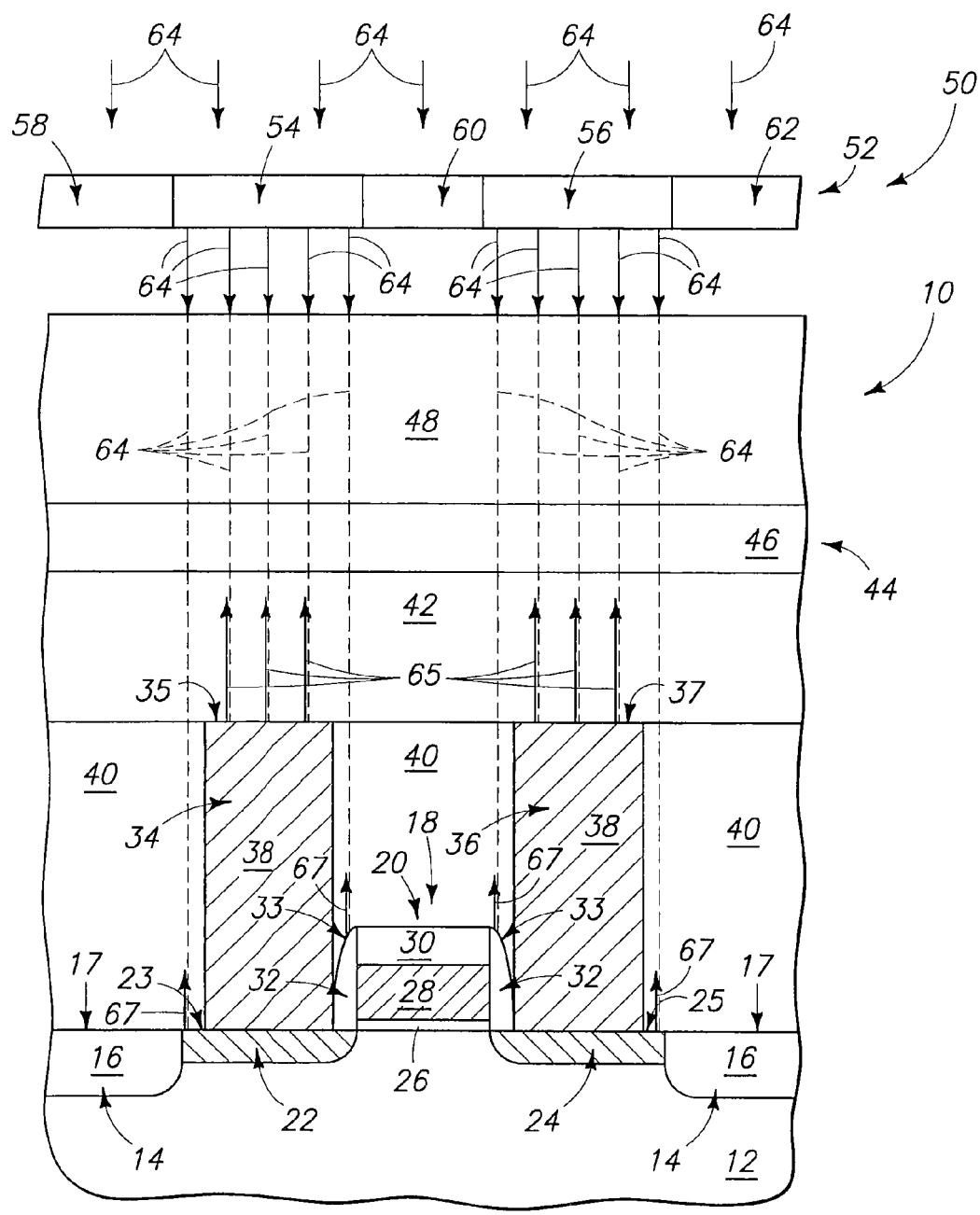
FIG. 3 is a view of the assembly of FIG. 2 shown at a processing stage subsequent to that of FIG. 2.

Referring to FIG. 3, some of the electromagnetic radiation 64 passes entirely through the photoresist, and into construction 10. Such electromagnetic radiation is indicated by dashed lines in FIG. 3. Some of the electromagnetic radiation passing into construction 10 penetrates through materials 42 and 46. Such electromagnetic radiation can reach reflective surfaces 35 and 37 and be reflected (or bounced) back toward photoresist 48 as indicated by arrows 65. Some of electromagnetic radiation passing into construction 10 can also impact surfaces of material 40 adjacent the pedestals 34 and 36. Material 40 can be less reflective than the material 38 of the pedestals, and accordingly can absorb most of the electromagnetic radiation rather than reflecting it.

In the shown aspect, material 40 is somewhat transparent so that at least some of the electromagnetic radiation reaching material 40 passes through the material to reach surfaces underlying material 40 (such as, for example, one or more of the shown surfaces 17, 23, 25, 31 and 33).

Some of the electromagnetic radiation reaching surfaces underlying material 40 is reflected back toward photoresist 48 as indicated by arrows 67. The arrows 67 are shorter than the arrows 65 to indicate that in the shown aspect of the invention, the magnitude of reflection from the various surfaces underlying material 40 is less than the magnitude of reflection from the upper surfaces 35 and 37 of pedestals 34 and 36. Such can result from the surfaces 35 and 37 being of more reflective compositions than the surfaces underlying material 40. In other words, the surfaces 35 and 37 can have a higher ratio of reflectance to absorbance than the surfaces underlying material 40.

Figure 4:
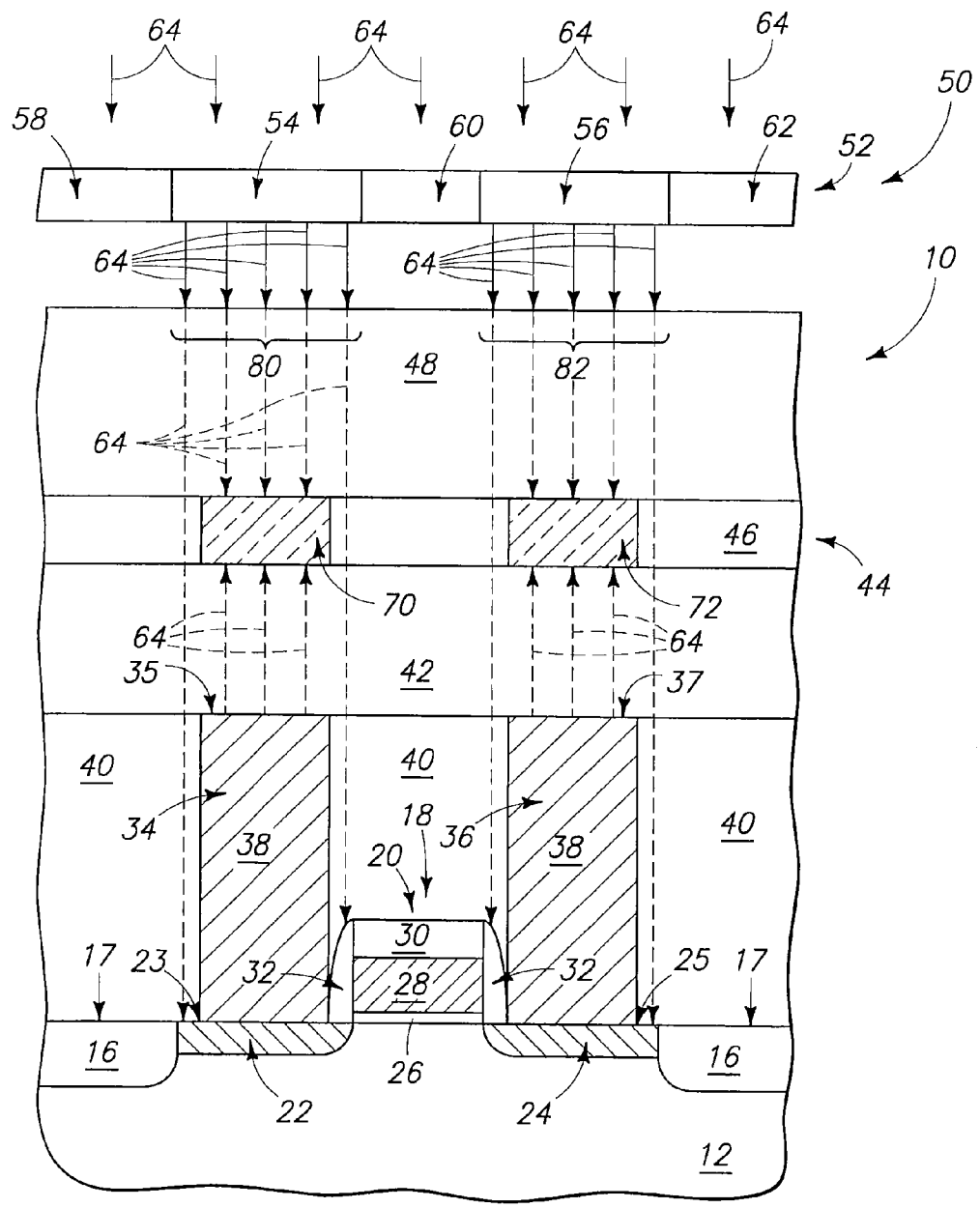
FIG. 4 is a view of the assembly of FIG. 2 shown at a processing stage subsequent to that of FIG. 3.

Referring to FIG. 4, the radiation 64 directed through photoresist 48, in combination with that reflecting back from surfaces 35 and 37 of the pedestals, alters transparency of segments 70 and 72 of material 46. Specifically, such segments receive a sufficient dose of the radiation to cause photobleaching of the photo-bleachable material 46. The magnitude arrows 65 of FIG. 3 are not shown in FIG. 4 in order to simplify the drawing, and instead the reflected radiation is shown as dashed-line arrows of radiation 64 directed from surfaces 35 and 37 toward material 46. To the extent that any electromagnetic radiation reflects from surfaces other than the surfaces 35 and 37, such is insufficient to substantially alter transparency of photo-bleachable material 46 (in other words, is insufficient to form photo-bleached regions over such other surfaces analogous to the photo-bleached regions 70 and 72 that are generated over surfaces 35 and 37).

In the shown aspect of the invention, the windows 54 and 56 of reticle 52 form patterns of radiation which expose regions 80 and 82 of the photoresist to the incoming radiation. Such regions are wider than the uppermost portions of pedestals 34 and 36. However, the radiation reflected back from surfaces 35 and 37 of the pedestals forms windows 70 and 72 in photo-bleachable material 46 that are about the same widths as the uppermost portions of the pedestals. Such aspect of the invention is shown to occur when utilizing on-axis radiation. It is to be understood that the invention also includes aspects in which off-axis radiation is utilized (not shown).

Figure 5:
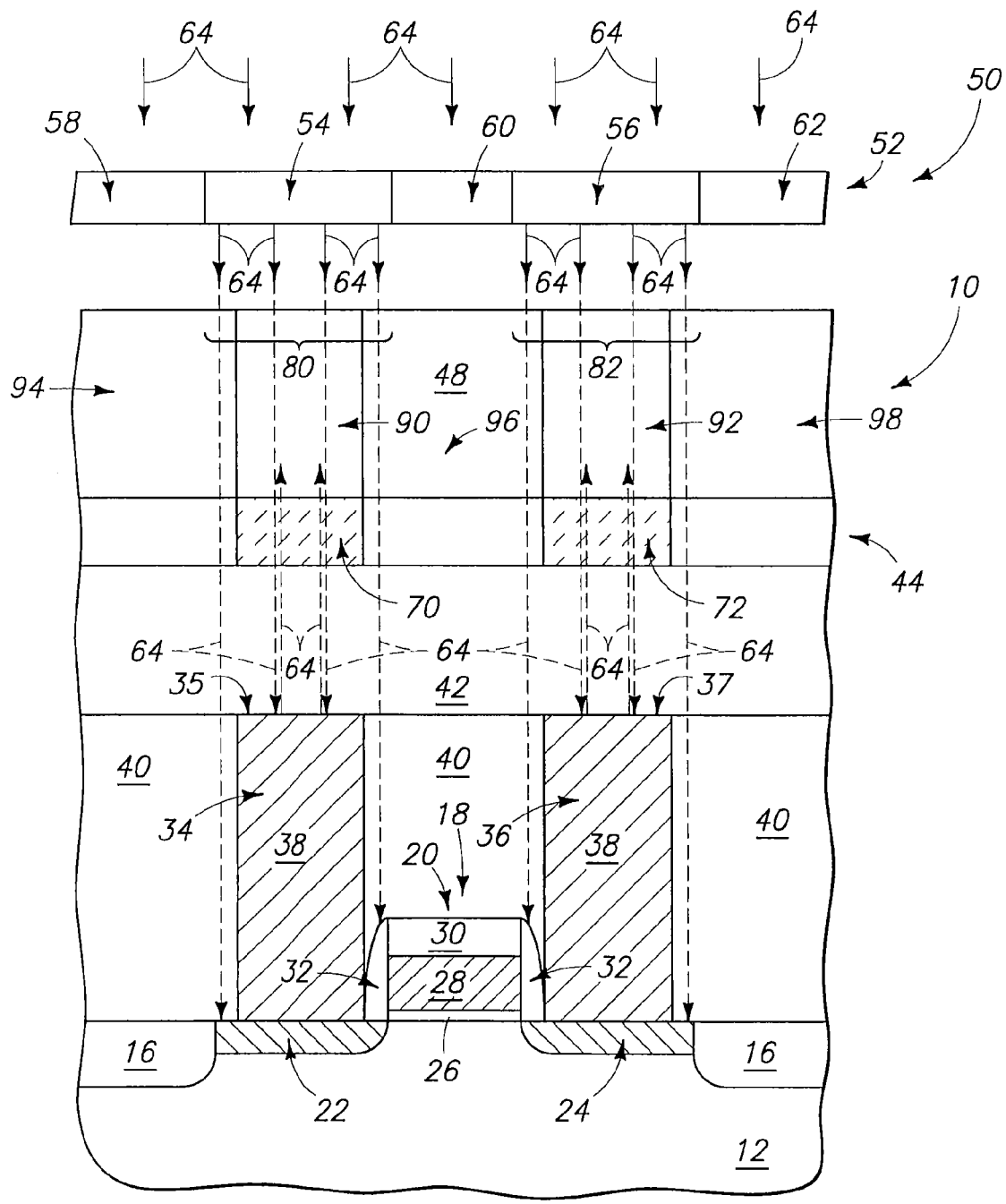
FIG. 5 is a view of the assembly of FIG. 2 shown at a processing stage subsequent to that of FIG. 4.

Referring to FIG. 5, the electromagnetic radiation directed into the photoresist, together with electromagnetic radiation bouncing from surfaces 35 and 37 back through altered segments 70 and 72 of material 46, causes portions 90 and 92 of the photoresist to be exposed to a threshold dose of radiation suitable for development of the resist. Other portions of the resist which receive no radiation, or which receive only the radiation directed into the photoresist and not the radiation reflected back to the photoresist, do not receive the threshold dose. Such other portions are labeled as 94, 96 and 98 in FIG. 5. The portions of resist 48 receiving the threshold dose can be referred to as first portions, and the portions of resist 48 not receiving the threshold dose can be referred to as second portions.

In the shown aspect of the invention, the portions 90 and 92 of resist 48 that receive the threshold dose of radiation are directly over pedestals 34 and 36. Further, such portions have widths corresponding to the widths of segments 70 and 72, and thus have widths smaller than the widths 80 and 82 of the patterned radiation directed through reticle 52. Accordingly, reticle 52 can be considered to coarsely define locations of resist 48 where a threshold dose of radiation will be provided, and methodology of the present invention can be considered to utilize reflective properties of structures underlying the photoresist to more accurately define the locations where the threshold dose will be provided. Methodology of the present invention can thus increase accuracy of alignment of an image pattern formed in photoresist over underlying structures, relative to the alignment occurring through utilization of photomask 52 alone. The present invention can therefore be utilized to compensate for mask misalignment.

Figure 6:
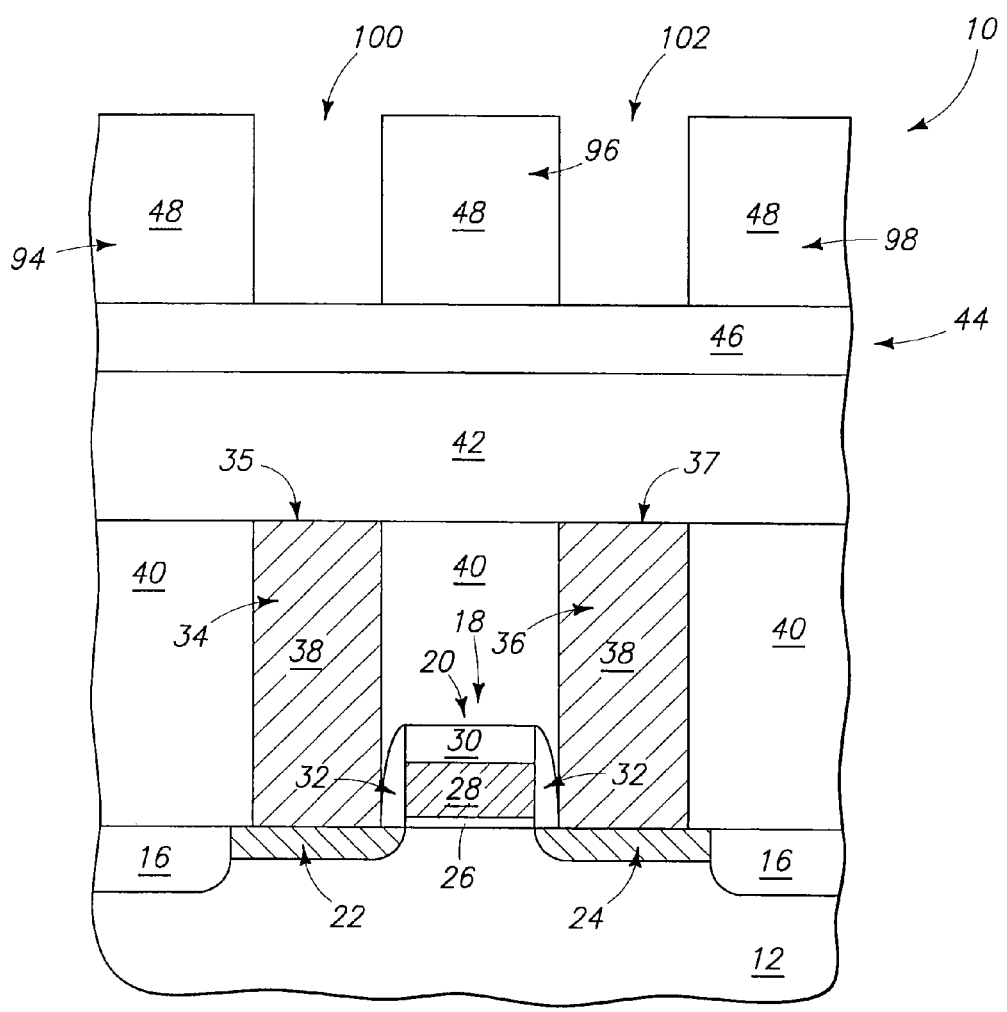
FIG. 6 is a view of the fragment of FIG. 1 shown at a processing stage subsequent to that of FIG. 5.

Referring to FIG. 6, construction 10 is shown removed from apparatus 50 (FIG. 5), and after development to remove the portions 90 and 92 (FIG. 5) of the photoresist 48 that had been exposed to the threshold dose of radiation, while leaving the portions 94, 96 and 98 of the photoresist that had not been exposed to the threshold dose of radiation. The shown aspect of the invention utilizes a positive photoresist, and accordingly the portions exposed to the threshold dose of radiation are removed by the development of the photoresist. The invention includes other aspects (discussed below with reference to FIG. 10) in which negative photoresist is utilized, and accordingly the portions of photoresist 48 which did not receive the threshold dose of radiation are removed by the development of the photoresist. Regardless, the portions of the photoresist exposed to the threshold dose of radiation can be considered to be first portions, and those not exposed to the threshold dose of radiation can be considered to be second portions, and the development can be considered to selectively remove either the first or second portions relative to the other of the first and second portions.

The removal of the first portions of the photoresist forms gaps 100 and 102 extending through the photoresist to the optically saturable absorption layer 46. The gaps 100 and 102 are directly over pedestals 34 and 36, respectively.

Figure 7:
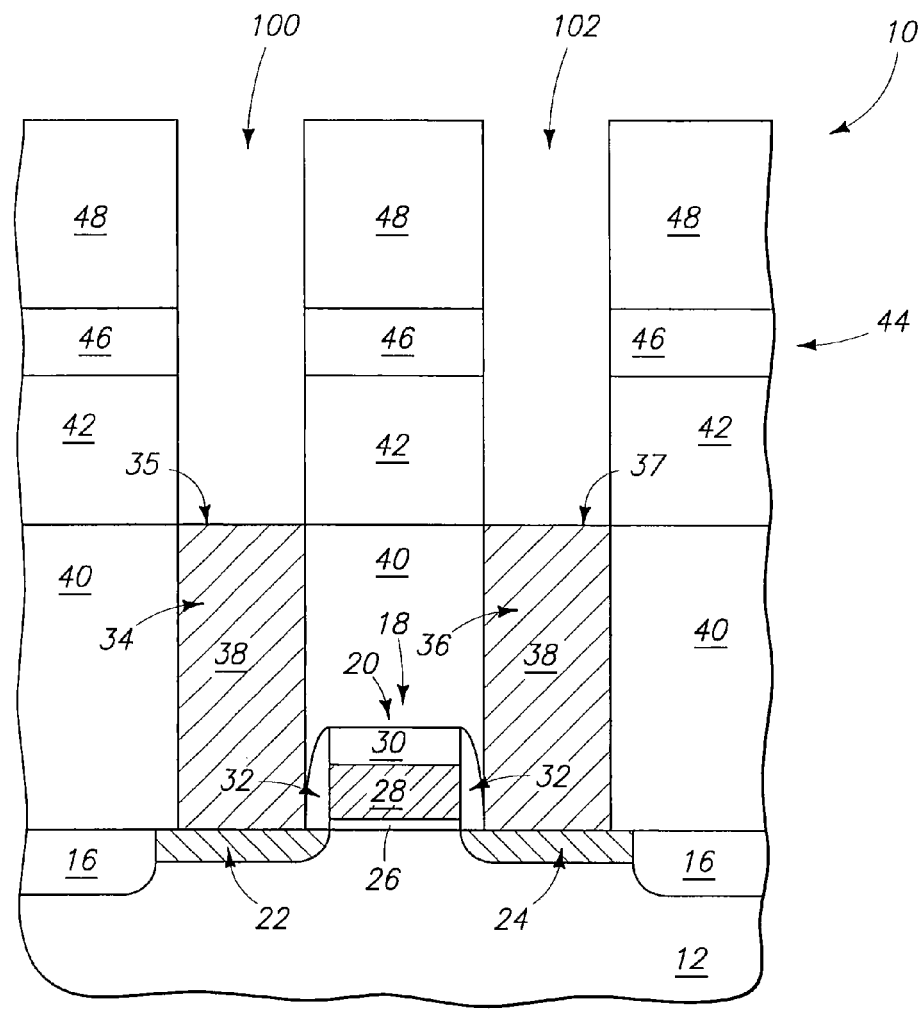
FIG. 7 is a view of the fragment of FIG. 1 shown at a processing stage subsequent to that of FIG. 6.

Referring to FIG. 7, the openings 100 and 102 are extended through materials 42 and 46 with an appropriate etch, or combination of etches, to expose upper surfaces 35 and 37 of pedestals 34 and 36. In some aspects (not shown) the etching can extend into material 38, rather than stopping precisely at surfaces 35 and 37.

Referring to FIG. 8, conductive material 104 is formed within openings 100 and 102; and materials 46 and 48 (FIG. 7) are removed. Construction 10 is shown comprising a planarized surface 103 extending across conductive material 104 and electrically insulative material 42. Such planarized surface can occur by, for example, over-filling openings 100 and 102 with the conductive material, and subsequently removing excess conductive material by chemical-mechanical polishing. The materials 46 and 48 can be removed before or after formation of conductive material 104, and in some aspects can be removed by the chemical-mechanical polishing utilized to form planarized surface 103.

The conductive material 104 forms a pair of electrically-conductive interconnects 106 and 108 which are well-aligned with underlying pedestals 34 and 36, respectively. Conductive material 104 can comprise any suitable composition or combination of compositions, and in some aspects can comprise, consist essentially of, or consist of one or more of various metals, metal compositions and conductively-doped semiconductor material. Although material 104 is shown to be homogeneous, it is to be understood that the material can, in some aspects, comprise two or more layers of differing composition relative to one another.

Figure 9:
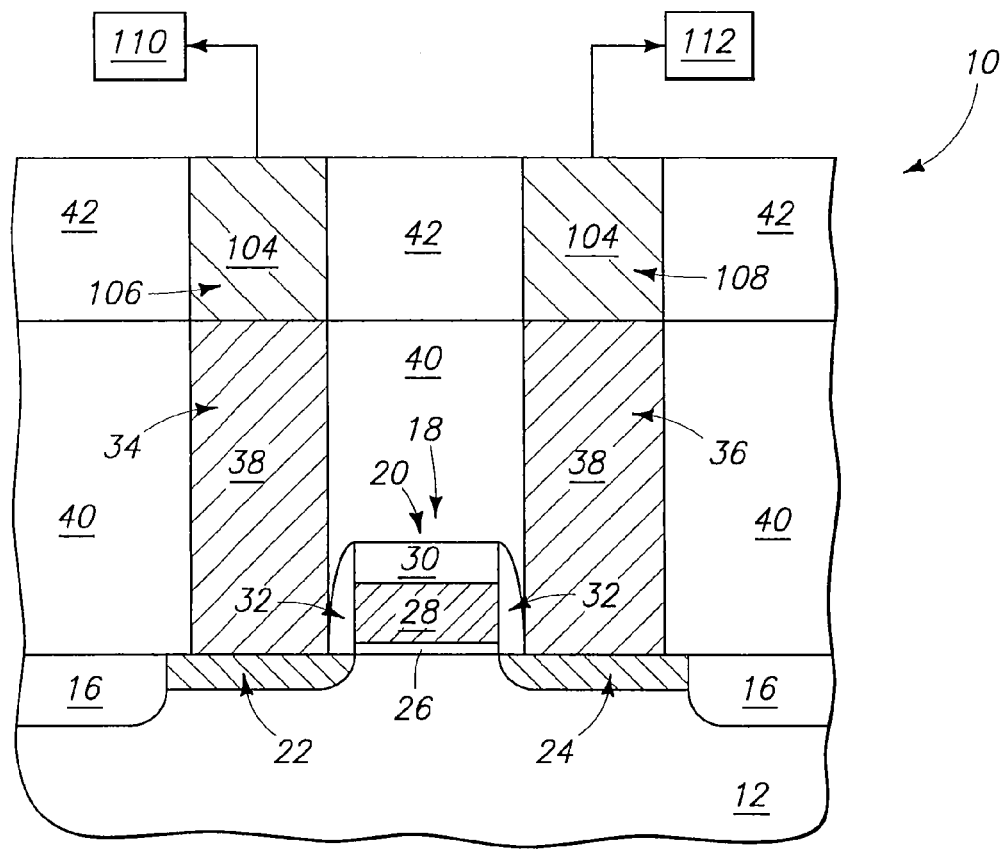
FIG. 9 is a view of the fragment of FIG. 1 shown at a processing stage subsequent to that of FIG. 8.

The interconnects 106 and 108 can be utilized for electrically connecting electrically-conductive pedestals 34 and 36 to circuitry which is ultimately desired to be electrically coupled with source/drain regions 22 and 24. For instance, FIG. 9 shows interconnect 106 electrically coupled with a bitline 110, and shows interconnect 108 electrically coupled with a charge storage device 112 (such as, for example, a capacitor). As is known to persons ordinary skill in the art, a dynamic random access memory (DRAM) unit cell comprises a charge storage device coupled to a bitline through a transistor. Accordingly, the structure of FIG. 9 can be considered to comprise a DRAM unit cell. A plurality of such structures can be simultaneously fabricated to form a DRAM array. The DRAM array can be incorporated into an electronic system, such as, for example, a system utilized in a computer, a car, a clock or an airplane.

The structure of FIG. 9 is but one exemplary structure which can be fabricated utilizing methodologies of the present invention, and persons of ordinary skill in the art will recognize that the present invention can be applied to numerous other applications in which it is desired to accurately photolithographically pattern photoresist.

The development of photoresist 48 discussed above with reference to FIG. 6 showed removal of the regions of the photoresist which received the threshold dose of radiation (regions 90 and 92 of FIG. 5). FIG. 10 illustrates an alternative aspect of the invention in which the development removes portions of the photoresist which did not receive the threshold dose of radiation (portions 94, 96 and 98 of FIG. 5). Such removal forms gaps 114, 116, and 118 extending through the photoresist to material 46, and leaves regions 90 and 92 of the photoresist as projections between the gaps and directly over pedestals 34 and 36. In subsequent processing analogous to that discussed above with reference to FIG. 7, the gaps can be extended through layers 42 and 46, and into or through material 40. Structures can then be formed within gaps, with exemplary structures being capacitor constructions which are ultimately to be incorporated into DRAM devices.

Figure 11:
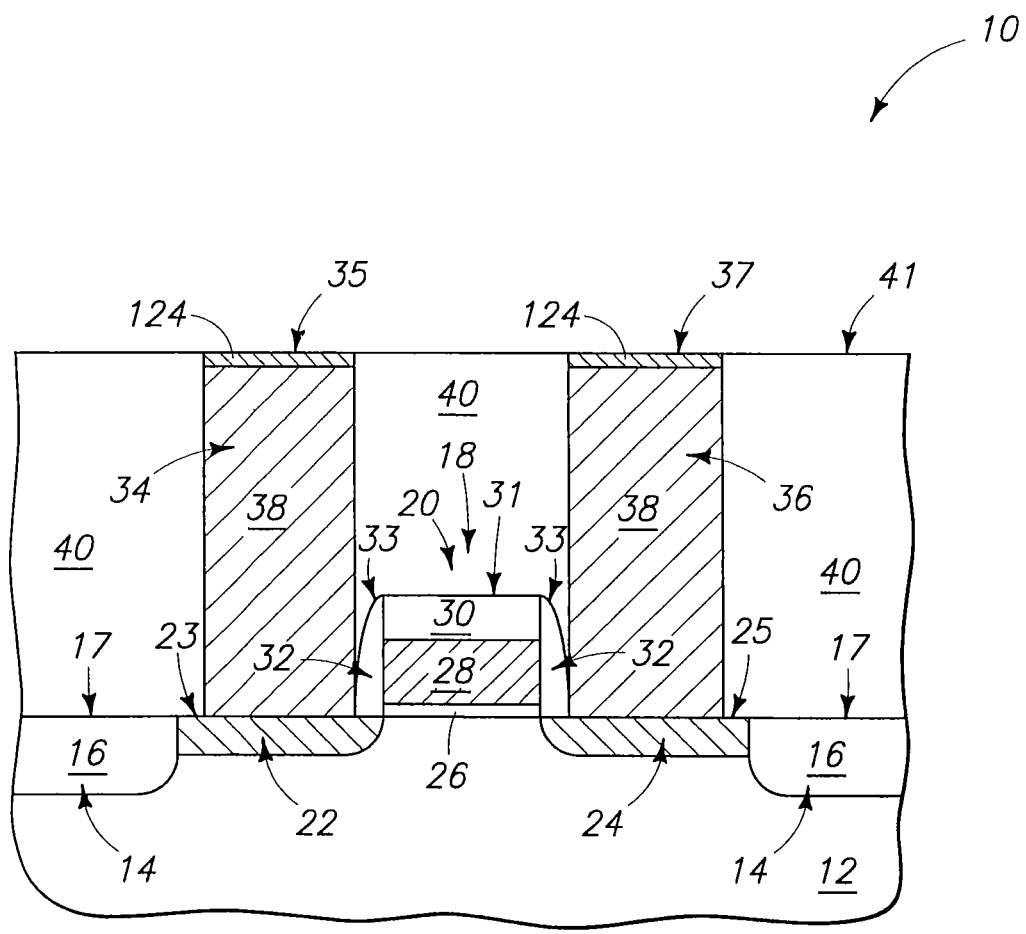
FIG. 11 is a diagrammatic, cross-sectional view of a semiconductor wafer fragment shown at a processing stage analogous to that of FIG. 1 in accordance with another aspect of the present invention.

The processing discussed above with reference to FIG. 1 indicated that surfaces 35 and 37 had a different reflectivity than surfaces 17, 23, 25, 31 and 33. In some aspects, the reflectivity of particular surfaces of a topography can be altered to enhance differences in reflectivity of some regions of the topography relative to other regions. FIG. 11 shows a construction 10 illustrating an exemplary application of such aspects. The construction of FIG. 11 comprises the pedestals 38 discussed previously with reference to FIG. 1, and the surfaces 17, 23, 25 and 33 which were also discussed previously.

The construction of FIG. 11 differs from that of FIG. 1 in that upper regions of pedestals 34 and 36 are modified to form material 124. In an exemplary application, material 38 of the pedestals can comprise, consist essentially of, or consist of conductively-doped silicon; and material 124 can comprise, consist essentially of, or consist of metal silicide (for instance, titanium silicide) formed from the silicon of the pedestals.

The conversion of upper regions of the pedestals to metal silicide can enhance a difference in reflectivity of the surfaces 35 and 37 of the pedestals relative to one or more of the surfaces 17, 23, 25, 33 and 31. For instance, surfaces 23 and 25 of the source/drain regions can comprise conductively-doped monocrystalline silicon, and such may have a reflectivity too close to that of the silicon of the pedestals for some aspects of the invention. Accordingly, the upper regions of the pedestals can be converted to metal silicide to create a significant difference in reflectivity between the upper surfaces of the pedestals and the surfaces 23 and 25 of the source/drain regions. The construction of FIG. 11 can subsequently be treated analogously to the processing of FIGS. 2-9 to form interconnects extending to metal silicide material 124.

Although the aspect of FIG. 11 is shown increasing reflectivity of surfaces, it is to be understood that the invention can also include aspects in which one or more surfaces are treated to reduce reflectivity of such surfaces. Reduction of reflectivity of some surfaces can also enhance a difference in reflectivity between the treated surfaces and other surfaces.

FIGS. 1-9 and 11 illustrate aspects of the invention for forming electrically-conductive structures extending to electrical interconnects. Another aspect of the invention is for forming electrically-conductive capacitor storage node structures. Such aspect is discussed with reference to FIGS. 12-17. Similar numbering will be used in describing FIGS. 12-17 as was used above in describing FIGS. 1-11, where appropriate.

Referring to FIG. 12, such shows a construction 150 at a processing stage analogous to that discussed above with reference to FIG. 1. The construction 150 comprises the substrate 12, isolation regions 14, and transistor 18 discussed previously. The transistor 18 comprises the gate stack 20 having materials 26, 28 and 30 discussed above; and comprises the source/drain regions 22 and 24. The construction 150 further comprises the sidewall spacers 32 along sidewalls of the gate stack, and comprises electrically insulative material 40 over the transistor 18 and the substrate.

Construction 150 differs from the construction 10 of FIG. 1 in that construction 150 comprises a short pedestal 152 extending from source/drain region 22 to a capacitor storage node 156. The pedestal 152 comprises a material 154, which can be any suitable composition or combination of compositions, including, for example, various metals, metal compositions, and conductively-doped semiconductor materials. Similarly, storage node 156 comprises a material 158 that can be any suitable composition or combination of compositions, including the various exemplary compositions discussed above for material 154.

The storage node 156 is shaped as an upwardly-opening container, and accordingly, in the shown cross-sectional view comprises a pair of spaced pedestals 157 and 159. However, as is known to persons ordinary skill in the art, the container-shape of storage node 156 would have a continuous lateral sidewall when viewed from above, with the pedestals 157 and 159 being part of that lateral sidewall. In particular aspects, the container sidewall would be circular or elliptical when viewed from above.

An electrically insulative material 160 is within the container opening of the storage node. Such material can be identical in composition to the material 40, or can be different. In particular aspects, material 160 can comprise BPSG, PSG, FSG, silicon dioxide and/or silicon nitride.

A planarized upper surface 161 is shown to extend across storage node material 158, insulative material 40, and insulative material 160. Such surface can be formed by, for example, chemical-mechanical polishing. The material 160 comprises an upper surface 165.

Capacitor storage node 158 comprise an uppermost surface 163, and construction 10 also comprises surfaces 17, 23, 25, 31, 33 and 165 adjacent the storage node. The surfaces 17, 23, 25, 31, 33, 163 and 165 can be considered to define a topography, with the surface 163 having a higher reflectivity than the other surfaces of the topography. To the extent that surface 163 does not have sufficiently high reflectivity relative to other surfaces of the topography, surface 163 and/or other surfaces of the topography can be treated to increase the relative difference in reflectivity between surface 163 and the other surfaces (with an exemplary treatment being analogous to that discussed above with reference to FIG. 11).

Figure 13:
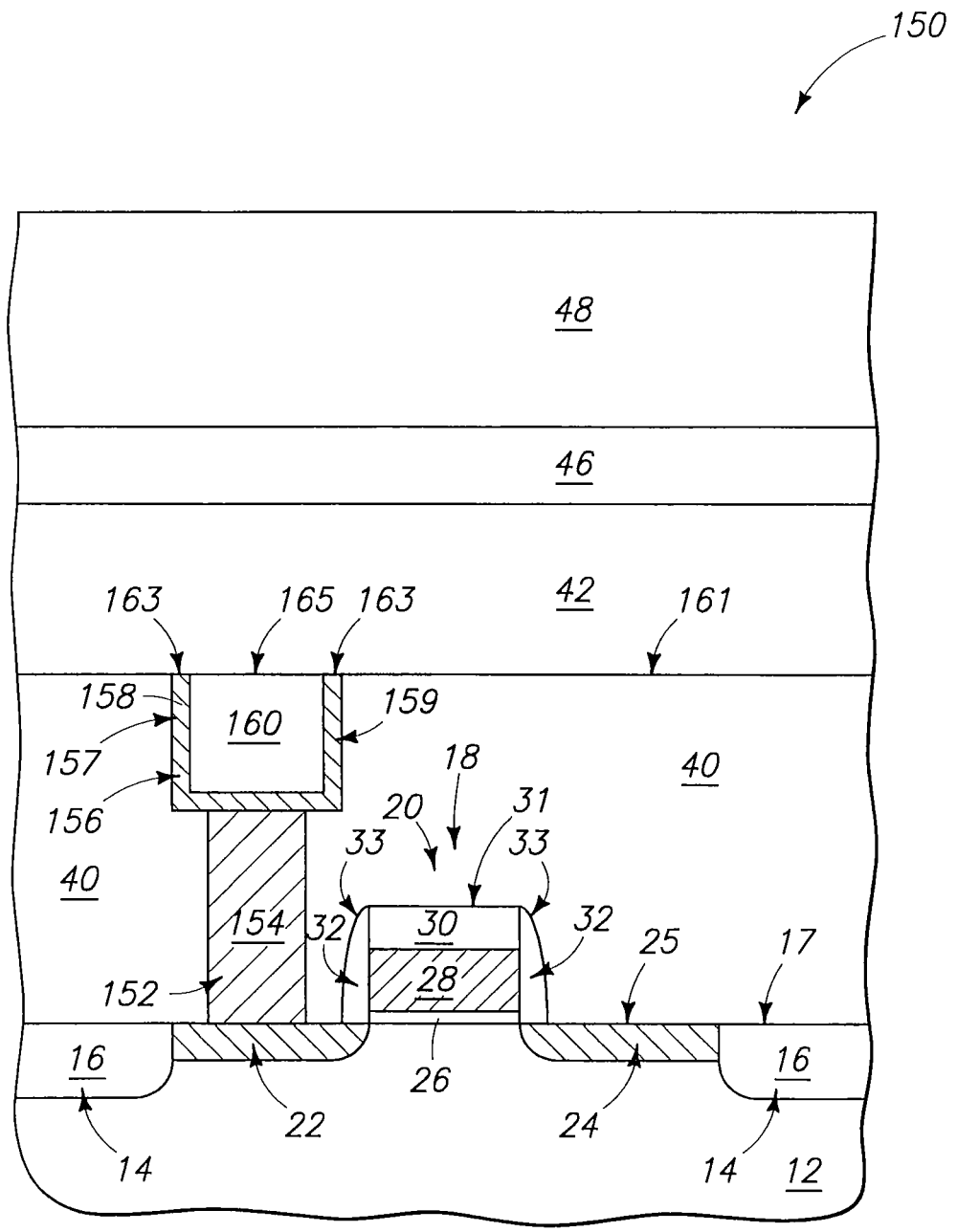
FIG. 13 is a view of the fragment of FIG. 12 shown at a processing stage subsequent to that of FIG. 12.

Referring next to FIG. 13, materials 42, 46 and 48 of the type discussed above with reference to FIG. 2 are formed over surface 161. Material 42 comprises an electrically insulative material, material 46 comprises an optically saturable absorption layer, and material 48 comprises photoresist.

Figure 14:
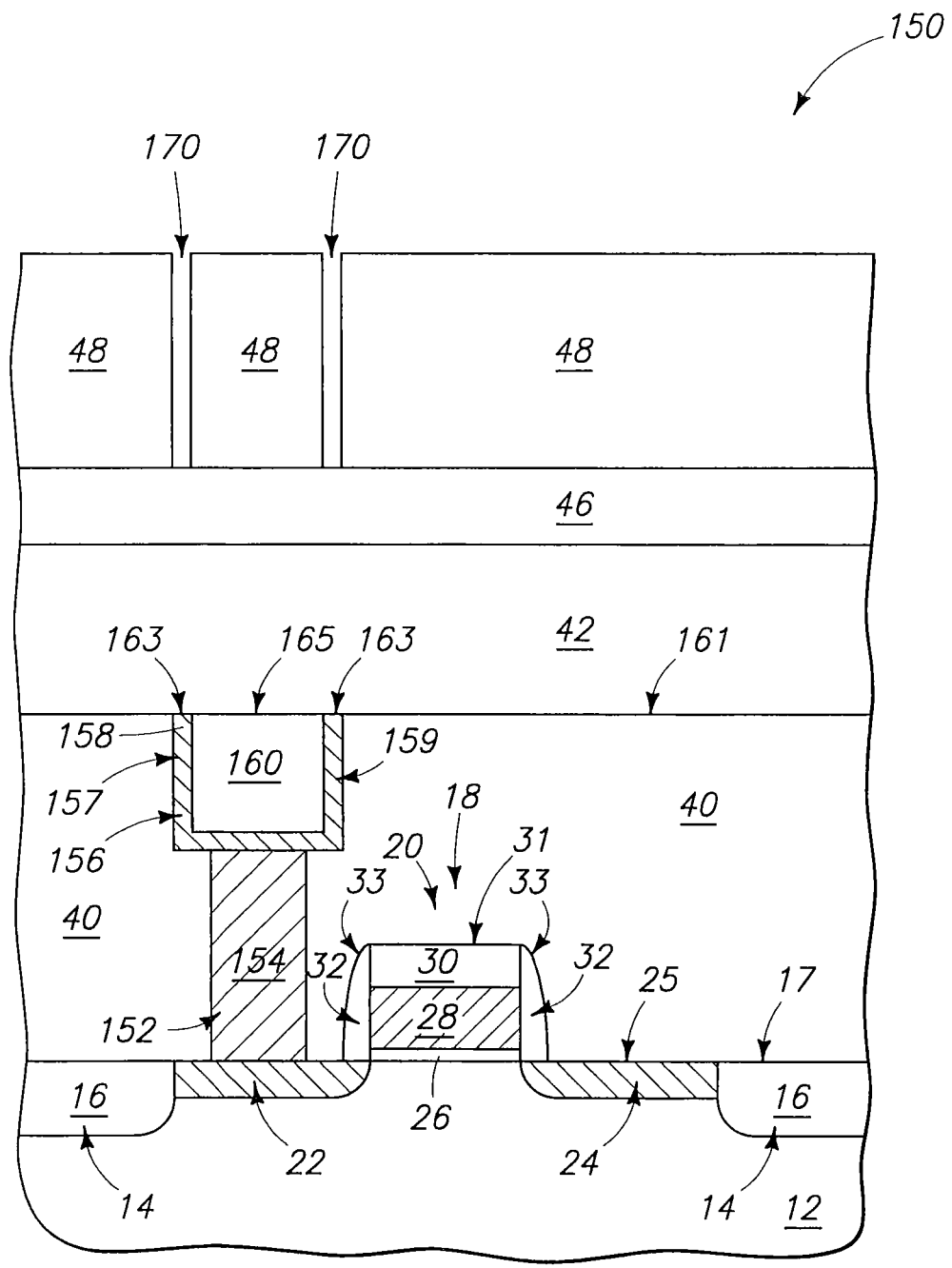
FIG. 14 is a view of the fragment of FIG. 12 shown at a processing stage subsequent to that of FIG. 13.

Referring next to FIG. 14, construction 150 is subjected to photolithographic processing and development analogous to that discussed above with reference to FIGS. 2-6. Such forms gaps 170 over surface 163. The gaps 170 are directly over reflective surface 163, as result of taking advantage of the difference in reflectivity between surface 163 and adjacent surfaces 17, 23, 25, 31, 33 and 165 during photolithographic patterning.

As discussed previously, storage node 156 would have a continuous sidewall comprising the projections 57 and 59 of the shown cross-sectional view. Accordingly, surface 163 would extend entirely around such sidewall. The apparent pair of gaps 170 in the cross-sectional view of FIG. 14 would thus be a single gap having the same lateral shape as the sidewall of the container-shaped storage node. However, in order to be consistent with the apparent pair of gaps in the shown cross-sectional views of FIG. 14 and the remaining figures, construction 150 will be referred to as having "gaps" 170, even though such gaps would actually be a single gap in the three-dimensional structure represented by the two-dimensional view of FIG. 14.

Figure 15:
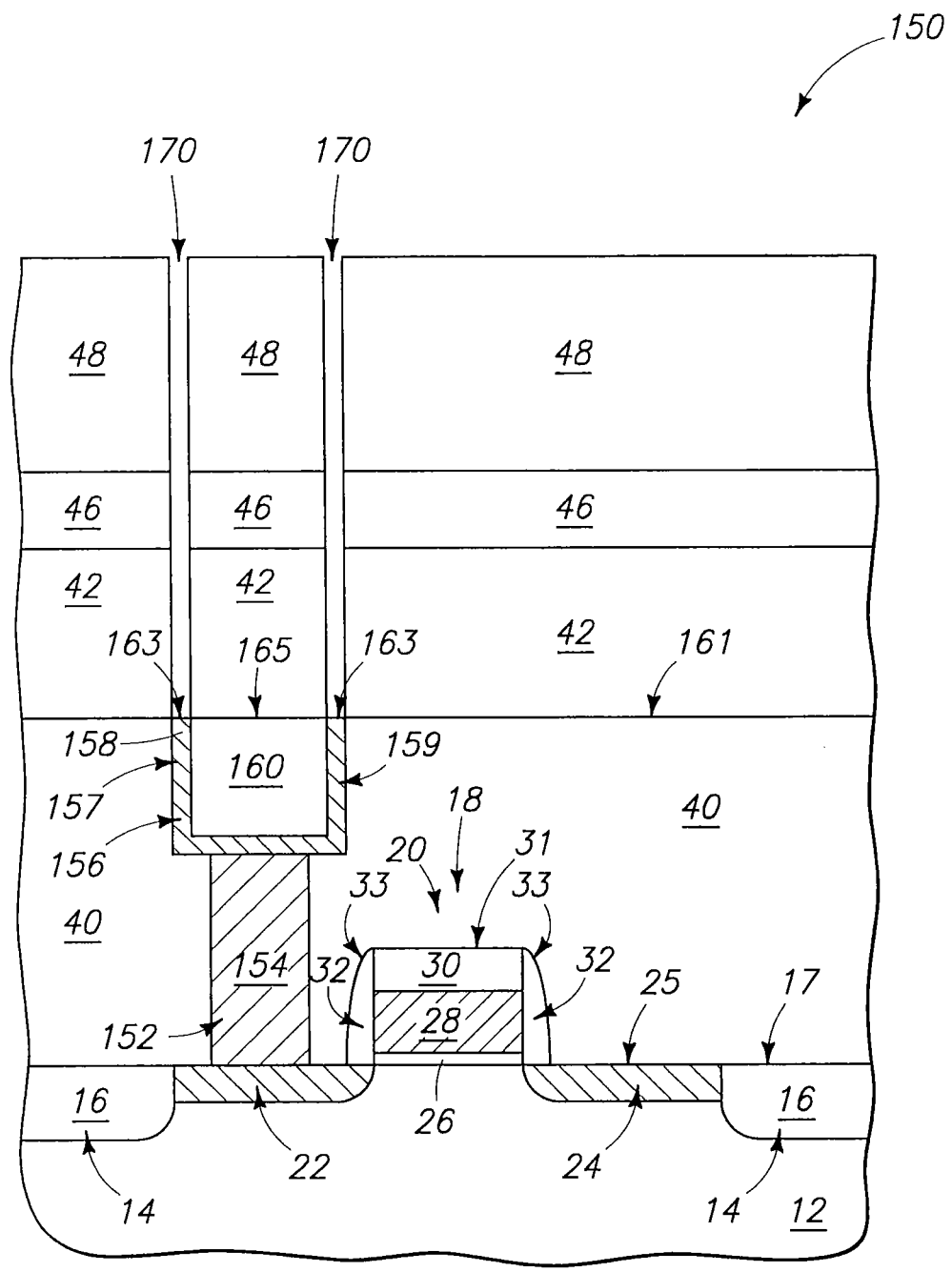
FIG. 15 is a view of the fragment of FIG. 12 shown at a processing stage subsequent to that of FIG. 14.

Referring to FIG. 15, gaps 170 are extended to surface 163 with an appropriate etch or combination of etches.

Figure 16:
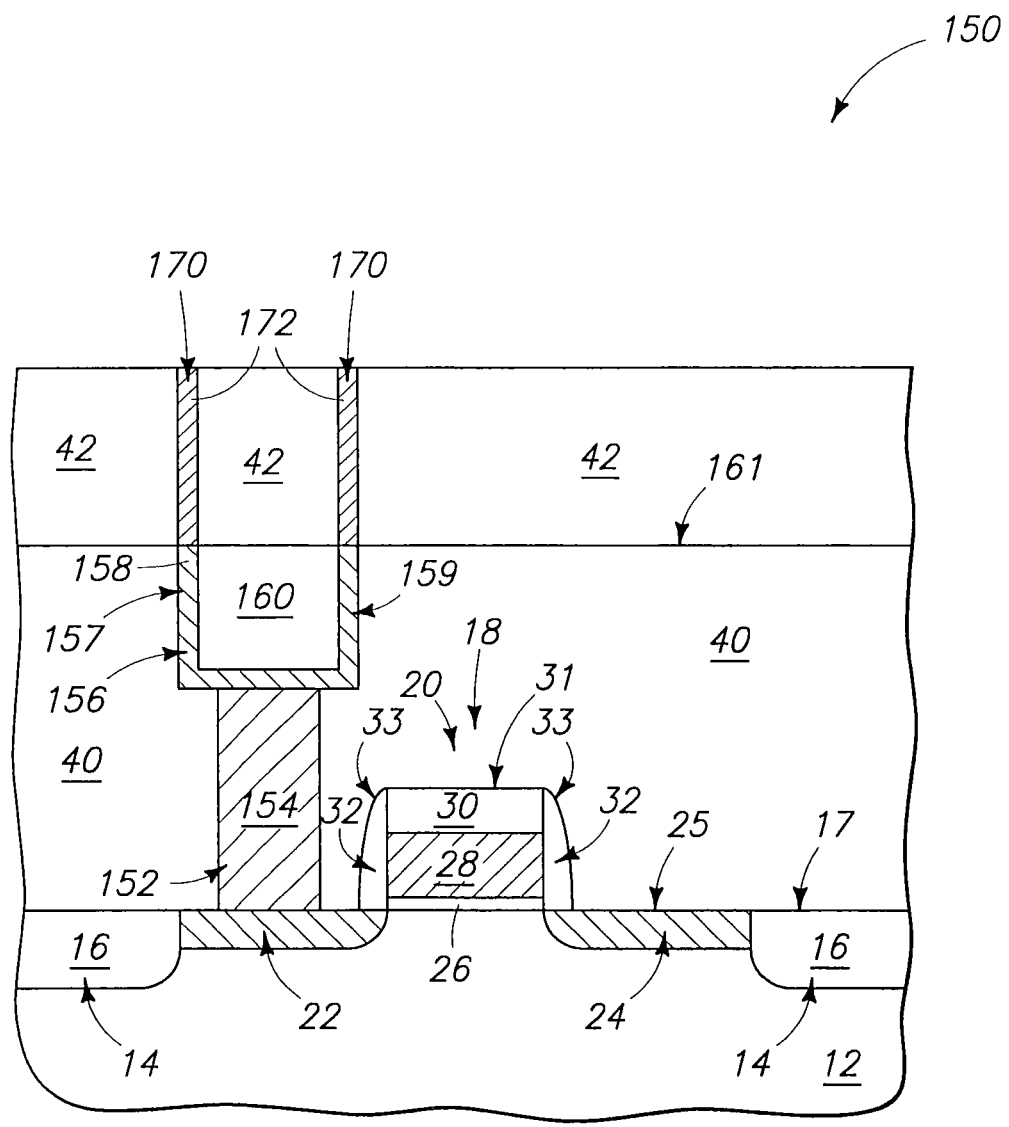
FIG. 16 is a view of the fragment of FIG. 12 shown at a processing stage subsequent to that of FIG. 15.

Referring next to FIG. 16, layers 46 and 48 (FIG. 15) are removed, and gaps 170 are filled with conductive material 172. Such conductive material can be identical to the conductive material 158, or different. Conductive material 172 extends the upwardly-opening capacitor storage node through layer 42.

Figure 17:
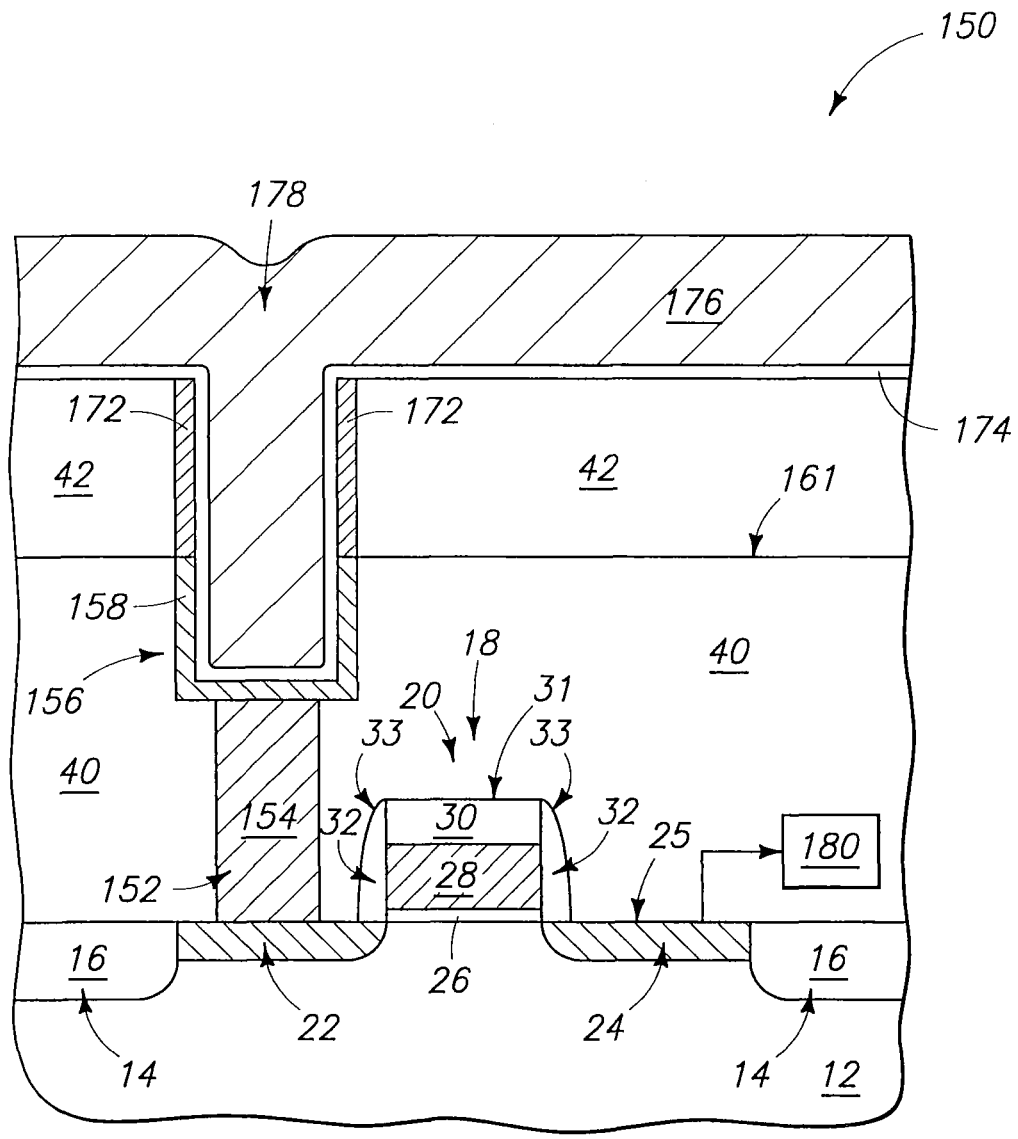
FIG. 17 is a view of the fragment of FIG. 12 shown at a processing stage subsequent to that of FIG. 16.

Referring to FIG. 17, materials 160 and 42 are removed from within the container shape of the capacitor storage node, and subsequently dielectric material 174 and capacitor plate material 176 are provided within the container shape of the capacitor storage node. The capacitor plate material is separated from storage node material 158 and 172 by dielectric material 174, but is capacitively coupled to such storage node material.

The combination of the storage node, dielectric material and capacitor plate material forms a capacitor 178. Such capacitor is but one exemplary capacitor that can be formed utilizing methodology of the present invention. In other applications, the dielectric material and capacitor plate material can extend along the outside of the container shape as well is within the inside of the container shape. Also, in other applications the capacitor can be a pedestal-type capacitor rather than a container-type capacitor.

Source/drain region 22 is shown connected to a bitline 180 to form a DRAM unit cell comprising the capacitor 178 and transistor 18.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a semiconductor substrate;
   in at least one cross-sectional view, spaced projections over the substrate, the spaced projections being spaced from one another by an intervening region;
   a first layer over the spaced projections and over the intervening region between the spaced projections, at least one of the following two uppermost surfaces terminating at a bottommost surface of the first layer: an uppermost surface of respective space projections and an uppermost surface of an intervening region;
   an optically saturable absorption layer over the first layer;
   photoresist over the optically saturable absorption layer; and
   wherein the spaced projections correspond to an upwardly-opening container structure, and wherein the intervening region comprises insulative material within the container structure.

2. The construction of claim 1 wherein the spaced projections comprise conductively-doped silicon capped with metal silicide.

3. The construction of claim 1 wherein the spaced projections correspond to pedestals, and wherein the intervening region comprises a transistor gate stack.

4. The construction of claim 1 wherein the optically saturable absorption layer comprises a plurality of optically saturable absorption layers.

5. The construction of claim 1 further comprising a source/drain for a transistor, the source/drain in contact with one of the spaced projections.

6. The construction of claim 1 further comprising a capacitor storage node in contact with at least one of the following: the spaced projections, the first layer and material in the intervening region.

7. A semiconductor construction, comprising:
   a semiconductor substrate;
   in at least one cross-sectional view, spaced projections over the substrate, the spaced projections being spaced from one another by an intervening region;
   a first layer over the spaced projections and over the intervening region between the spaced projections;
   an optically saturable absorption layer over the first layer;
   photoresist over the optically saturable absorption layer;
   a capacitor storage node in contact with one of the spaced projections; and wherein the capacitor storage node is located only in material in the intervening region.

8. The construction of claim 7 wherein the capacitor storage node is further in contact with at least one of the following: the first layer and material in the intervening region.

9. The construction of claim 8 wherein the capacitor storage node is further in contact with both of the first layer and the material in the intervening region.

10. A semiconductor construction, comprising:
a semiconductor substrate;
in at least one cross-sectional view, spaced projections over the substrate, the spaced projections being spaced from one another by an intervening region;
a first layer over the spaced projections and over the intervening region between the spaced projections;
an optically saturable absorption layer over the first layer;
photoresist over the optically saturable absorption layer; and
an opening for a capacitor storage node, the opening extends through at least two of the following: material in the intervening region, the first layer, the optically saturable absorption layer and the photoresist.

11. The construction of claim 10 further comprising capacitor storage node material in only the material of the intervening region.

12. The construction of claim 10 wherein the opening extends into at least three of the following: the material of the intervening region, the first layer, the optically saturable absorption layer and the photoresist.

13. The construction of claim 10 further comprising capacitor storage node material in contact with one of the spaced projections and wherein the opening is over the capacitor storage node material.

\* \* \* \* \*